(12) United States Patent
Scheiper et al.

(10) Patent No.: US 8,609,533 B2
(45) Date of Patent: Dec. 17, 2013

(54) METHODS FOR FABRICATING INTEGRATED CIRCUITS HAVING SUBSTRATE CONTACTS AND INTEGRATED CIRCUITS HAVING SUBSTRATE CONTACTS

(75) Inventors: Thilo Scheiper, Dresden (DE); Stefan Flachowsky, Dresden (DE); Jan Hoentschel, Dresden (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 82 days.

(21) Appl. No.: 13/436,323

(22) Filed: Mar. 30, 2012

(65) Prior Publication Data

US 2013/0256901 A1 Oct. 3, 2013

(51) Int. Cl.
- *H01L 21/311* (2006.01)
- *H01L 21/314* (2006.01)
- *H01L 21/3205* (2006.01)
- *H01L 21/4763* (2006.01)

(52) U.S. Cl.
USPC ........... 438/637; 438/639; 438/667; 438/700; 438/702; 438/735; 438/744; 257/635; 257/640; 257/734

(58) Field of Classification Search
USPC ......... 438/700, 702, 723, 724, 735, 743, 744, 438/758, 778, 791; 257/632, 635, 640, 649, 257/734
See application file for complete search history.

(56) References Cited

U.S. PATENT DOCUMENTS

| | | | |
|---|---|---|---|
| 6,649,964 B2 | 11/2003 | Kim | |
| 7,396,718 B2 * | 7/2008 | Frohberg et al. | 438/233 |
| 7,939,896 B2 | 5/2011 | Dang et al. | |
| 7,943,442 B2 * | 5/2011 | Gehring et al. | 438/152 |
| 8,097,519 B2 * | 1/2012 | Wiatr et al. | 438/311 |
| 8,377,761 B2 * | 2/2013 | Gehring et al. | 438/153 |
| 8,436,425 B2 * | 5/2013 | Heinrich et al. | 257/350 |
| 2003/0181005 A1 * | 9/2003 | Hachimine et al. | 438/231 |
| 2005/0269642 A1 * | 12/2005 | Minami | 257/355 |
| 2006/0091471 A1 * | 5/2006 | Frohberg et al. | 257/369 |
| 2008/0230917 A1 * | 9/2008 | Chou et al. | 257/774 |
| 2008/0268585 A1 * | 10/2008 | Gehring et al. | 438/152 |
| 2009/0014807 A1 * | 1/2009 | Tang et al. | 257/369 |
| 2009/0111223 A1 * | 4/2009 | Wiatr et al. | 438/155 |
| 2009/0194844 A1 | 8/2009 | Richter | |
| 2010/0187586 A1 | 7/2010 | Pellela et al. | |
| 2011/0183477 A1 * | 7/2011 | Gehring et al. | 438/153 |
| 2011/0186929 A1 * | 8/2011 | Heinrich et al. | 257/350 |
| 2011/0186957 A1 | 8/2011 | Scheiper | |
| 2011/0210380 A1 | 9/2011 | Scheiper et al. | |
| 2012/0156839 A1 * | 6/2012 | Scheiper et al. | 438/229 |
| 2012/0217582 A1 * | 8/2012 | Baars et al. | 257/347 |

* cited by examiner

*Primary Examiner* — Fernando L Toledo
*Assistant Examiner* — Christine C Lau
(74) *Attorney, Agent, or Firm* — Ingrassia Fisher & Lorenz, P.C.

(57) ABSTRACT

Methods for fabricating integrated circuits having substrate contacts and integrated circuits having substrate contacts are provided. One method includes forming a first trench in a SOI substrate extending through a buried insulating layer to a silicon substrate. A metal silicide region is formed in the silicon substrate exposed by the first trench. A first stress-inducing layer is formed overlying the metal silicide region. A second stress-inducing layer is formed overlying the first stress-inducing layer. An ILD layer of dielectric material is formed overlying the second stress-inducing layer. A second trench is formed extending through the ILD layer and the first and second stress-inducing layers to the metal silicide region. The second trench is filled with a conductive material.

20 Claims, 10 Drawing Sheets

METHODS FOR FABRICATING INTEGRATED CIRCUITS HAVING SUBSTRATE CONTACTS AND INTEGRATED CIRCUITS HAVING SUBSTRATE CONTACTS

TECHNICAL FIELD

The present invention relates generally to integrated circuits, and more particularly relates to methods for fabricating integrated circuits having substrate contacts and integrated circuits having substrate contacts.

BACKGROUND

Transistors such as metal oxide semiconductor field effect transistors (MOSFETs) or simply field effect transistors (FETs) or MOS transistors are the core building blocks of the vast majority of semiconductor integrated circuits (ICs). A FET includes source and drain regions between which a current can flow through a channel under the influence of a bias applied to a gate electrode that overlies the channel. The ICs are usually formed using both P-channel FETs (PMOS transistors or PFETs) and N-channel FETs (NMOS transistors or NFETs) and the IC is then referred to as a complementary MOS or CMOS circuit.

Certain improvements in the performance of MOS ICs can be realized by forming the MOS transistors in a thin layer of semiconductor material (semiconductor layer) overlying a buried insulator layer that overlies a silicon substrate. Such semiconductor or silicon on insulator (SOI) MOS transistors, for example, exhibit lower junction capacitance and can operate at higher switching speeds than MOS transistors formed in bulk substrates. In SOI MOS transistors, the semiconductor layer, in which the source and drain regions are formed, is dielectrically encapsulated. In particular, the MOS transistors are typically enclosed in an interlayer dielectric material that overlies the semiconductor layer, which overlies the buried insulating layer. This configuration provides significant advantages but also give rise to certain issues.

One issue, especially in high performance devices such as microprocessors and the like, is that a thorough temperature sensing regime may be required across the substrate for device-internal temperature management because the buried insulating layer reduces the heat dissipation capabilities of the SOI devices. Temperature sensing can be accomplished using substrate contacts, for example, to form substrate diodes that are used to monitor the substrate temperature.

Typically, the substrate contacts are formed in the IC during the formation of the device contacts, which electrically couple to the source and drain regions of the MOS transistors. In one example, the device contacts are formed by etching a first set of trenches through the interlayer dielectric material to the source and drain regions of the MOS transistors, which are disposed in the semiconductor layer of the SOI substrate, and filling the first set of trenches with a conductive material. The substrate contacts are formed contemporaneously with the device contacts by etching a second set of trenches through the interlayer dielectric material to the silicon substrate, e.g., metal silicide region(s) disposed in the silicon substrate for improved electrical contact, and filling the second set of trenches with the conductive material. Because the silicon substrate is below the semiconductor and buried insulating layers of the SOI substrate, the formation of the second set of trenches requires a deeper etch through the interlayer dielectric material than for the first set of trenches. This deeper interlayer dielectric material etch can be more challenging and sometimes results in the formation of substrate contacts that marginally extend to the silicon substrate, which can negatively impact the performance and robustness of the substrate contacts.

Accordingly, it is desirable to provide methods for fabricating integrated circuits having substrate contacts with improved robustness, and integrated circuits fabricated by such methods. Furthermore, other desirable features and characteristics of the present invention will become apparent from the subsequent detailed description and the appended claims, taken in conjunction with the accompanying drawings and the foregoing technical field and background.

BRIEF SUMMARY

Methods for fabricating integrated circuits are provided herein. In accordance with an exemplary embodiment, a method for fabricating an integrated circuit includes forming a first trench in a SOI substrate extending through a buried insulating layer to a silicon substrate. A metal silicide region is formed in the silicon substrate exposed by the first trench. A first stress-inducing layer is formed overlying the metal silicide region. A second stress-inducing layer is formed overlying the first stress-inducing layer. The second stress-inducing layer has a different type of intrinsic stress than the first stress-inducing layer. An ILD layer of dielectric material is formed overlying the second stress-inducing layer. A second trench is formed extending through the ILD layer and the first and second stress-inducing layers to the metal silicide region. The second trench is filled with a conductive material.

In accordance with another exemplary embodiment, a method for fabricating an integrated circuit is provided. The method includes depositing a first stress-inducing layer overlying a first device region and a second device region of an SOI substrate. The first device region has a first transistor and a second transistor that are formed therein. The second device region has a first trench that extends through a buried insulating layer to a silicon substrate of the SOI substrate and a metal silicide region that is formed in the silicon substrate exposed by the first trench. A first portion of the first stress-inducing layer that overlies the second transistor is etched while a second remaining portion of the first stress-inducing layer that overlies the first transistor and the second device region is covered. A second stress-inducing layer is deposited overlying the first and second device regions. The second stress-inducing layer has a different type of intrinsic stress than the first stress-inducing layer. A third portion of the second stress-inducing layer that overlies the first transistor is etched while a fourth remaining portion of the second stress-inducing layer that overlies the second transistor and the second device region is covered. An ILD layer of dielectric material is deposited overlying the first and second device regions. A second trench is etched in the second device region extending through the ILD layer and the first and second stress-inducing layers that are disposed in the first trench to expose the metal silicide region. The second trench is filled with a conductive material.

In accordance with another exemplary embodiment, an integrated circuit including a substrate contact is provided. The integrated circuit includes a SOI substrate having a semiconductor layer, a silicon substrate, and a buried insulating layer that is disposed between the semiconductor layer and the silicon substrate. A metal silicide region is disposed in the silicon substrate. The SOI substrate has a filled trench formed therein extending through the buried insulating layer to the metal silicide region. A first stress-inducing layer is disposed in the filled trench overlying the metal silicide region. A second stress-inducing layer is disposed in the filled trench overlying the first stress-inducing layer. The second stress-inducing layer has a different type of intrinsic stress than the first stress-inducing layer. An ILD layer of dielectric material overlies the second stress-inducing layer. The substrate contact includes a conductive material that extends through the ILD layer and the first and second stress-inducing layers to the metal silicide region.

BRIEF DESCRIPTION OF THE DRAWINGS

The present invention will hereinafter be described in conjunction with the following drawing figures, wherein like numerals denote like elements.

FIGS. 1-10 illustrate the integrated circuit in cross sectional view during various stages of its fabrication.

DETAILED DESCRIPTION

Figure 1:
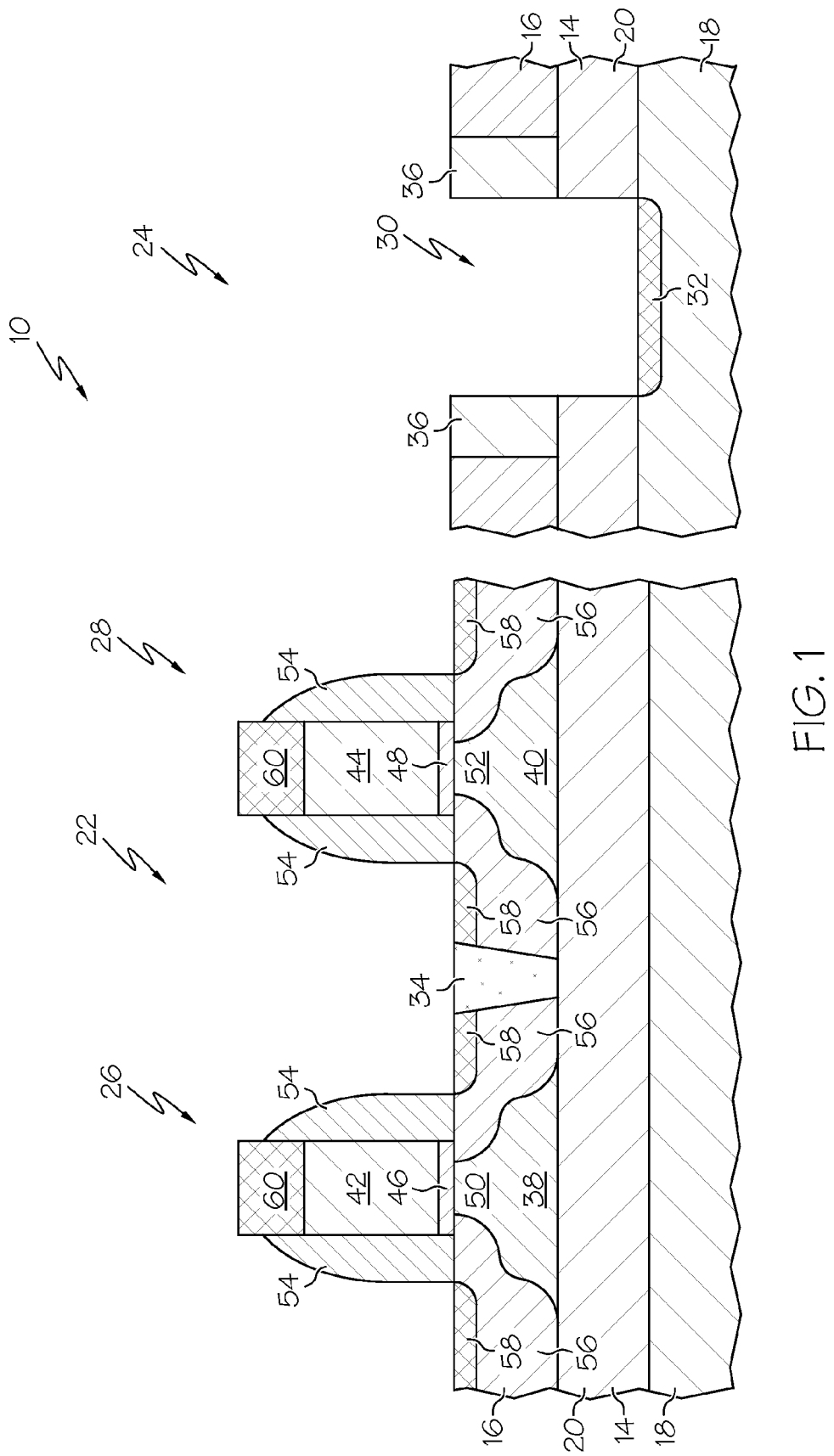
FIGS. 1-10 illustrate methods for fabricating integrated circuits having substrate contacts in accordance with various embodiments.

The following Detailed Description is merely exemplary in nature and is not intended to limit the invention or the application and uses of the invention. Furthermore, there is no intention to be bound by any theory presented in the preceding background or the following detailed description.

Various embodiments contemplated herein relate to methods for fabricating integrated circuits having substrate contacts and integrated circuits having substrate contacts. During intermediate stages of the fabrication of an integrated circuit (IC), a first stress-inducing layer is deposited over a first device region and a second device region of an SOI substrate. The SOI substrate has a semiconductor layer, a silicon substrate, and a buried insulating layer that is disposed between the semiconductor layer and the silicon substrate. The first device region has a first transistor and a second transistor that are formed in the semiconductor layer of the SOI substrate. The second device region has a first trench that extends into the SOI substrate through the buried insulating layer to the silicon substrate, and a metal silicide region that is formed in the silicon substrate and that is exposed by the first trench.

After deposition, the first stress-inducing layer overlies the first and second transistors, the first trench, and the metal silicide region. The first stress-inducing layer has a relatively high intrinsic stress, e.g., intrinsic tensile stress or intrinsic compressive stress, that for certain types of transistors, e.g., PFETs or NFETs, increases the charge carrier mobility of the transistors' channel regions to increase their drive capabilities. In particular, intrinsic tensile stresses in the vicinity of the channel regions of NFETs increases the charge carrier mobility of the NFETs' channel regions and intrinsic compressive stresses in the vicinity of the channel regions of PFETs increases the charge carrier mobility of the PFETs' channel regions.

In an exemplary embodiment, a portion of the first stress-inducing layer that overlies the second transistor is then etched while a remaining portion of the first stress-inducing layer that overlies the first transistor and the second device region is covered with an etch mask(s). The etch mask(s) is removed, and a second stress-inducing layer is deposited overlying the first and second device regions. The second stress-inducing layer has a relatively high intrinsic stress, e.g., intrinsic tensile stress or intrinsic compressive stress, that for certain types of transistors, e.g., PFETs or NFETs, increases the charge carrier mobility of the transistors' channel regions to increase their drive capabilities. In an exemplary embodiment, the second stress-inducing layer has a different type of intrinsic stress than the first stress-inducing layer. In one example, the first transistor is an NFET and the second transistor is a PFET, and the first stress-inducing layer has an intrinsic tensile stress and the second stress-inducing layer has an intrinsic compressive stress. After deposition, the second stress-inducing layer overlies the second transistor and the remaining portion of the first stress-inducing layer that overlies the first transistor, the first trench, and the metal silicide region.

In an exemplary embodiment, a portion of the second stress-inducing layer that overlies the first transistor is etched while a remaining portion of the second stress-inducing layer that overlies the second transistor and the second device region is covered with an etch mask(s). After removing a portion of the second stress-inducing layer, the first stress-inducing layer overlies the first transistor, the first trench, and the metal silicide region, and the second stress-inducing layer overlies the second transistor, the first trench, and a metal silicide region. As such, the first and second transistors are each covered by a single layer of stress-inducing material(s), e.g., a first stress-inducing layer overlies the first transistor and a second stress-inducing layer overlies the second transistor, and the first trench and the metal silicide region are covered by two layers of stress-inducing material(s), e.g., the first and second stress-inducing layers. In an exemplary embodiment, the first and second stress-inducing layers effectively function as spacer layers overlying the first trench and the metal silicide region in which each of the layers has a thickness of from about 20 to about 150 nm.

The etch mask(s) is removed, and an interlayer dielectric layer (ILD layer) of dielectric material is deposited overlying the first and second device regions. The ILD layer can be planarized using a CMP process. A second trench is etched in the second device region extending through the ILD layer and the first and second stress-inducing layers that are disposed in the first trench to expose the metal silicide region. In an exemplary embodiment, the second trench is formed by initially etching through the ILD layer using the second stress-inducing layer as an etch stop, and then etching through the first and second stress-inducing layers to the metal silicide region. Because the first trench and the metal silicide region are covered by the two layers of stress-inducing material(s) that effectively function as spacer layers, the depth of the second trench through the ILD layer, e.g., depth of the initial etch through the ILD layer, is reduced by the thickness of the layers of stress-inducing material(s). The second trench is then filled with a conductive material to form the substrate contact. As such, the substrate contact can be formed by performing a shallower etch through the interlayer dielectric material than conventional processes to improve the robustness of the substrate contact.

Figure 7:
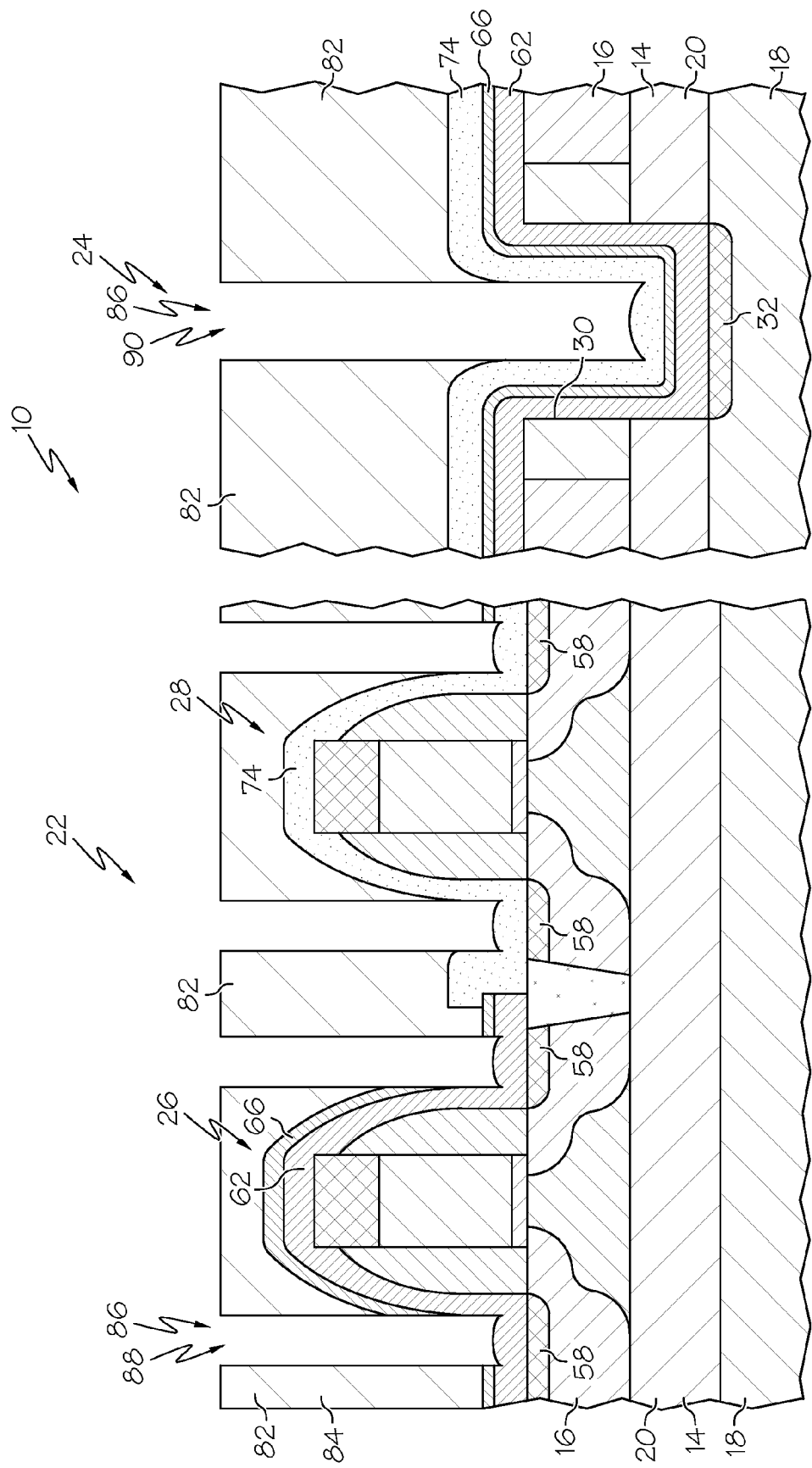
Figure 8:
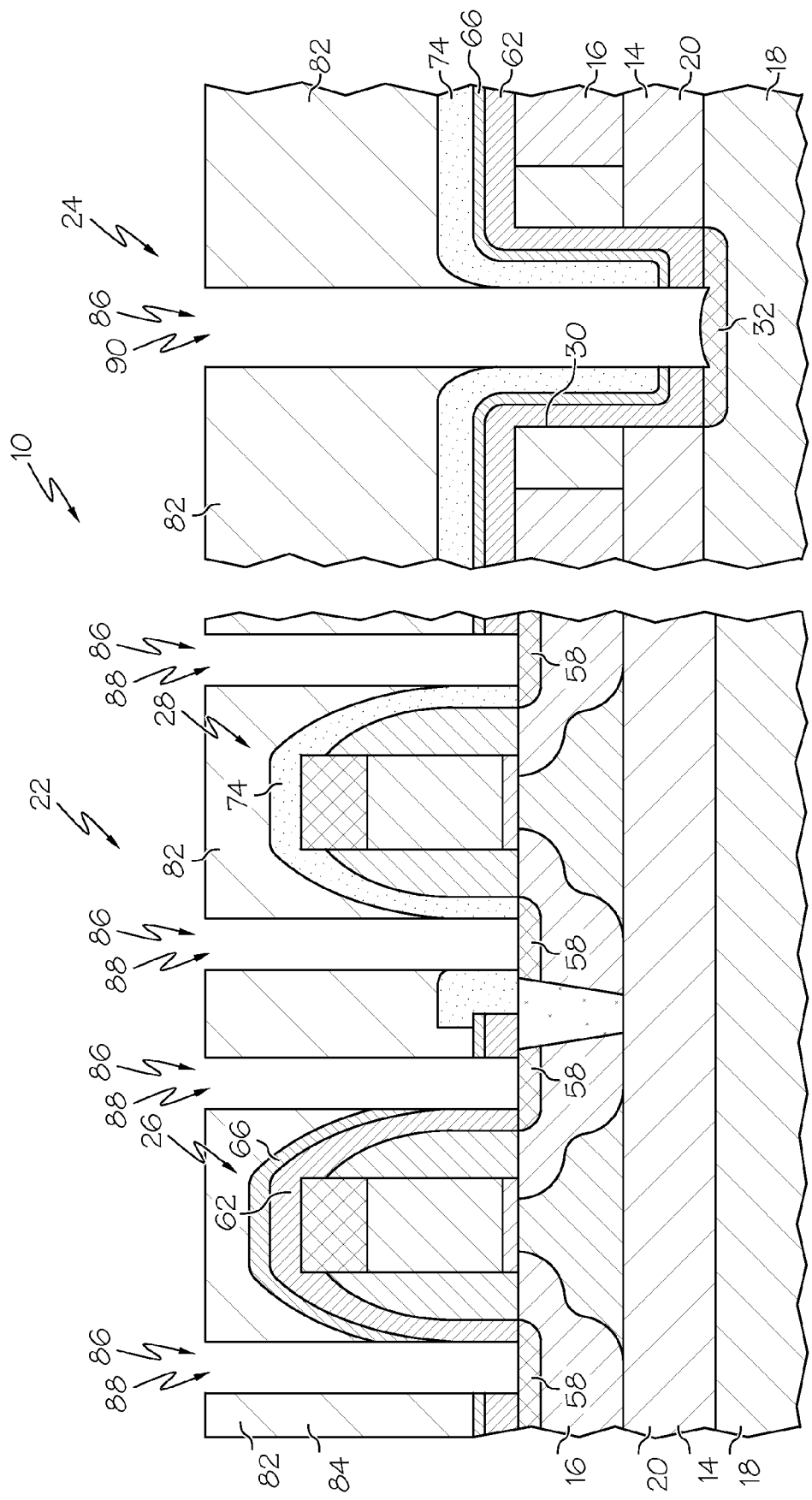
Figure 9:
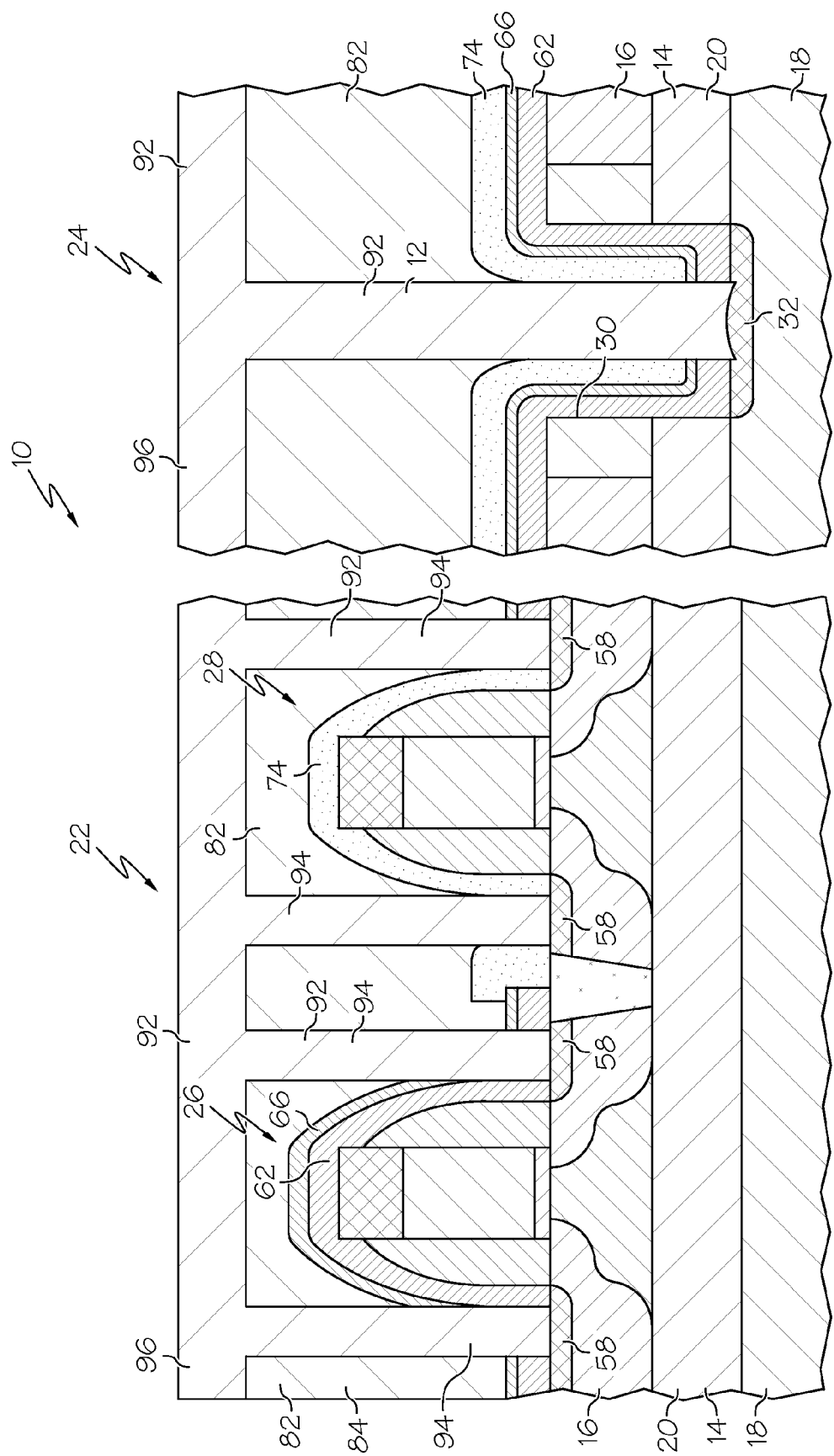
Figure 10:
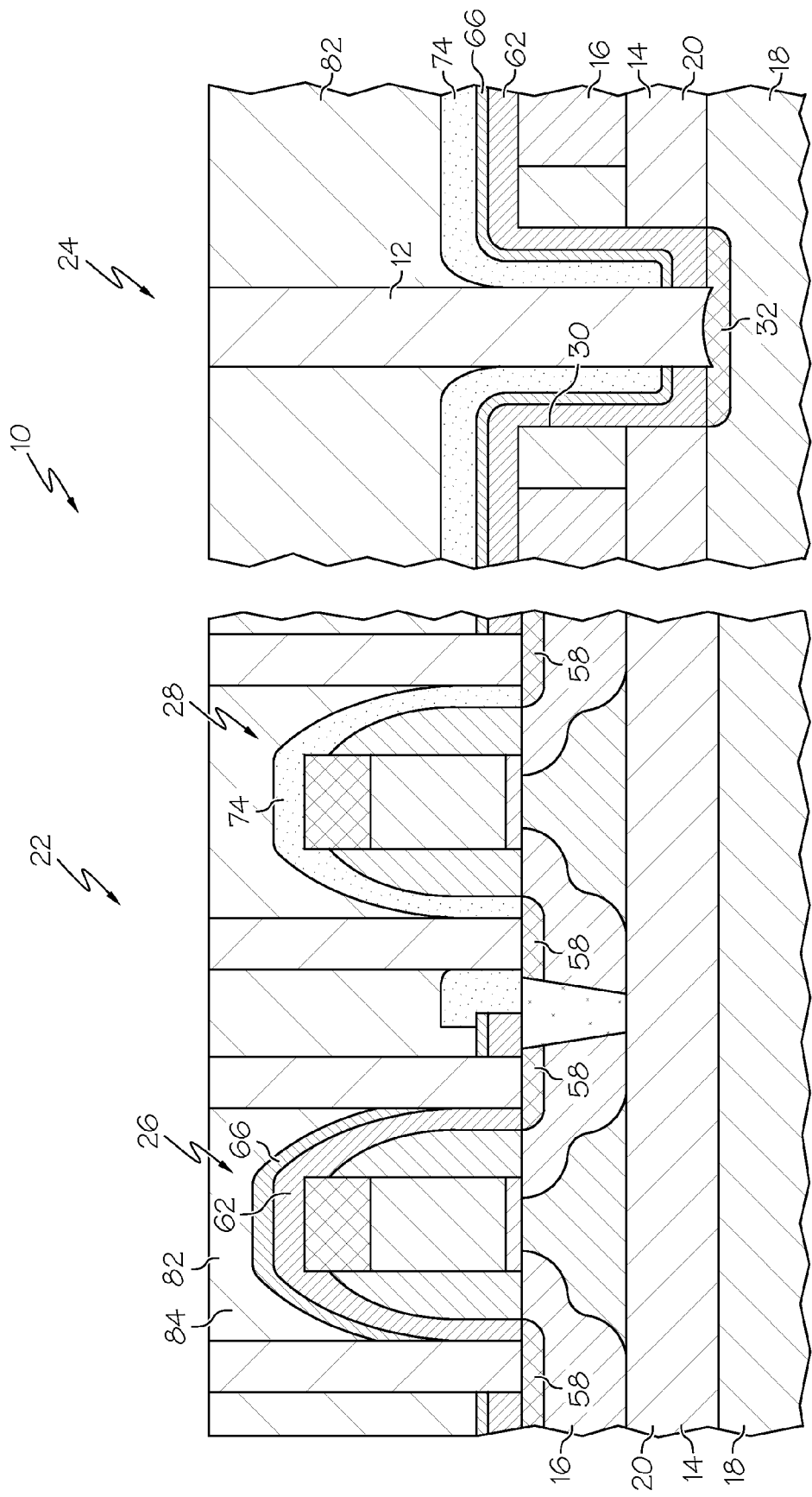

FIGS. 1-10 illustrate methods for fabricating an IC 10 including forming a substrate contact 12 in accordance with various embodiments. The described process steps, procedures, and materials are to be considered only as exemplary embodiments designed to illustrate to one of ordinary skill in the art methods for practicing the invention; the invention is not limited to these exemplary embodiments. The illustrated portion of the IC 10 at later stages of fabrication as shown in FIGS. 9-10 includes only a single substrate contact 12, although those of ordinary skill in the art will recognize that an actual IC could include a large number of such substrate contacts. Various steps in the fabrication of ICs are well known and so, in the interest of brevity, many conventional steps will only be mentioned briefly herein or will be omitted entirely without providing the well known process details.

FIG. 1 illustrates, in cross sectional view, a portion of the IC 10 at an intermediate stage of fabrication in accordance with an exemplary embodiment. The illustrated portion includes an SOI substrate 14. The SOI substrate 14 has a semiconductor layer 16, a silicon substrate 18, and a buried insulating layer 20. The semiconductor layer 16 may be formed of a substantially crystalline semiconductor material, such as silicon, silicon/germanium, or any other silicon-based material known to those skilled in the art. The silicon substrate 18 may be formed of a substantially crystalline silicon substrate material that may be doped or undoped in accordance with device requirements. The buried insulating layer 20 separates the semiconductor layer 16 and the silicon substrate 18 and is formed of an insulating material, such as silicon dioxide or the like.

The SOI substrate 14 has device regions 22 and 24 that may be adjacent to or spaced apart from each other. The device region 22 has transistors 26 and 28 that are formed in and on the semiconductor layer 16. The device region 24 has a trench 30 that extends through the semiconductor and buried insulating layers 16 and 20 to the silicon substrate 18. A metal silicide region 32 is formed in the silicon substrate 18 and is exposed by the trench 30.

As illustrated, isolation structures 34 and 36 are provided in the semiconductor layer 16 of both device regions 22 and 24. In the device region 22, the isolation structure 34 defines corresponding active regions 38 and 40, which are to be understood as semiconductor regions having formed therein and/or receiving an appropriate dopant profile as required for forming transistor elements. In one example, the active regions 38 and 40 correspond to active regions of the transistors 26 and 28 that represent an N-channel transistor (NFET) and a P-channel transistor (PFET), respectively.

The transistors 26 and 28 include corresponding gate electrode structures 42 and 44. The gate electrode structures 42 and 44 may include the same or different electrode material (s), such as silicon, silicon-germanium, metal-containing materials and the like. Gate insulating layers 46 and 48 separate the gate electrode structures 42 and 44 from channel regions 50 and 52, respectively, which are formed in the semiconductor layer 16. The transistors 26 and 28 include sidewall spacers 54 that are formed along the gate electrode structures 42 and 44. Source and drain regions 56 are formed in the semiconductor layer 16 laterally adjacent to the gate electrode structures 42 and 44, and metal silicide regions 58 and 60 are formed in the respective transistors 26 and 28. In particular, the metal silicide regions 58 are formed in the semiconductor layer 16 laterally offset from the respective channel regions 50 and 52 and are used for forming device contacts with the source and drain regions 56 of the transistors 26 and 28 as described in further detail below.

In the device region 24, the isolation structure 36, in combination with a respective portion of the buried insulating layer 20, define the trench 30 extending to the silicon substrate 18. The metal silicide region 32 defines a lower-most portion of the trench 30 and is for forming the substrate contact 12 (see FIGS. 9-10) as described in further detail below.

The IC 10 as shown in FIG. 1 may be formed on the basis of the following exemplary processes. After providing the SOI substrate 14, the isolation structures 34 and 36 are formed using lithography, etch, deposition, planarization techniques and the like. Next, the basic doping of the active regions 38 and 40 is established, for instance, by ion implantation. The process continues by forming the gate insulating layers 46 and 48 and the gate electrode structures 42 and 44 on the basis of oxidation and/or deposition techniques followed by the deposition of a gate electrode material that is patterned using lithography and etch techniques. The sidewall spacers 54 are formed along the gate electrode structures on the basis of oxidation and/or deposition techniques. The sidewall spacers 54 are further defined in accordance with process and device requirements so as to act as an implantation mask, at least at various fabrication stages of the implantation sequences, to establish the desired vertical and lateral dopant profiles for the source and drain regions 56 and the desired offset to the channel regions 50 and 52. It should be appreciated that respective implantation processes have to be performed differently for transistors of different conductivity types. That is, respective resist masks may be provided prior to a specific ion implantation process to prevent unwanted dopant species from being introduced into specific transistor elements. For example, a P-type dopant may be introduced into the active region(s) of an N-channel transistor(s), while a respective P-channel transistor(s) is covered by a resist mask. Thereafter, one or more annealing processes may be performed to activate the dopants. The process continues by forming the trench 30 on the basis of appropriate anisotropic etch techniques using a resist mask for etching through the material of the semiconductor layer 16 and/or isolation structure(s) 36 and the buried insulating layer 20. Thereafter, the metal silicide regions 32, 58, and 60 may be formed by depositing a refractory metal, such as, for example, cobalt, nickel, titanium, tantalum, platinum, palladium, and/or rhodium, and subsequently performing one or more heat treatments to initiate a chemical reaction to form metal silicide.

Figure 2:
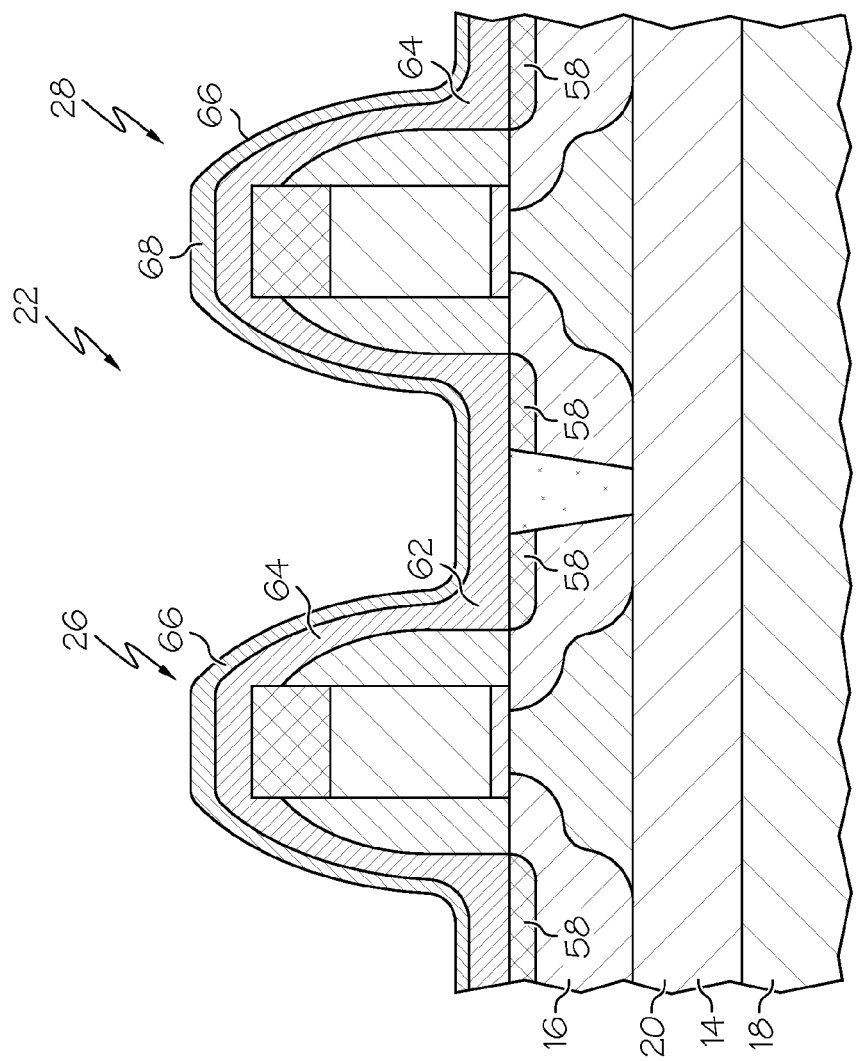

FIG. 2 illustrates, in cross sectional view, the IC 10 at a further advanced fabrication stage in accordance with an exemplary embodiment. A stress-inducing layer 62 is formed overlying the transistors 26 and 28, the trench 30, and the metal silicide region 32 by depositing a stress-inducing material 64 over the device regions 22 and 24. The stress-inducing material 64 may be deposited, for example, by using a plasma enhanced chemical vapor deposition (PECVD) process. In an exemplary embodiment, the stress-inducing layer 62 is formed having a thickness of from about 20 to about 150 nm. The stress-inducing material 64 can be any material, such as a layer of stress silicon nitride, capable of providing a relatively high intrinsic stress, e.g., intrinsic tensile stress or intrinsic compressive stress. In an exemplary embodiment, the stress-inducing layer 62 has an intrinsic tensile stress.

As illustrated, an oxide layer 66 is formed overlying the transistors 26 and 28, the trench 30, and the metal silicide region 32 by depositing an oxide material 68, such as silicon dioxide, over the stress-inducing layer 62 disposed overlying the device regions 22 and 24. In an exemplary embodiment, the oxide layer 66 is relatively thin and has a thickness of from about 5 to about 20 nm.

Figure 3:
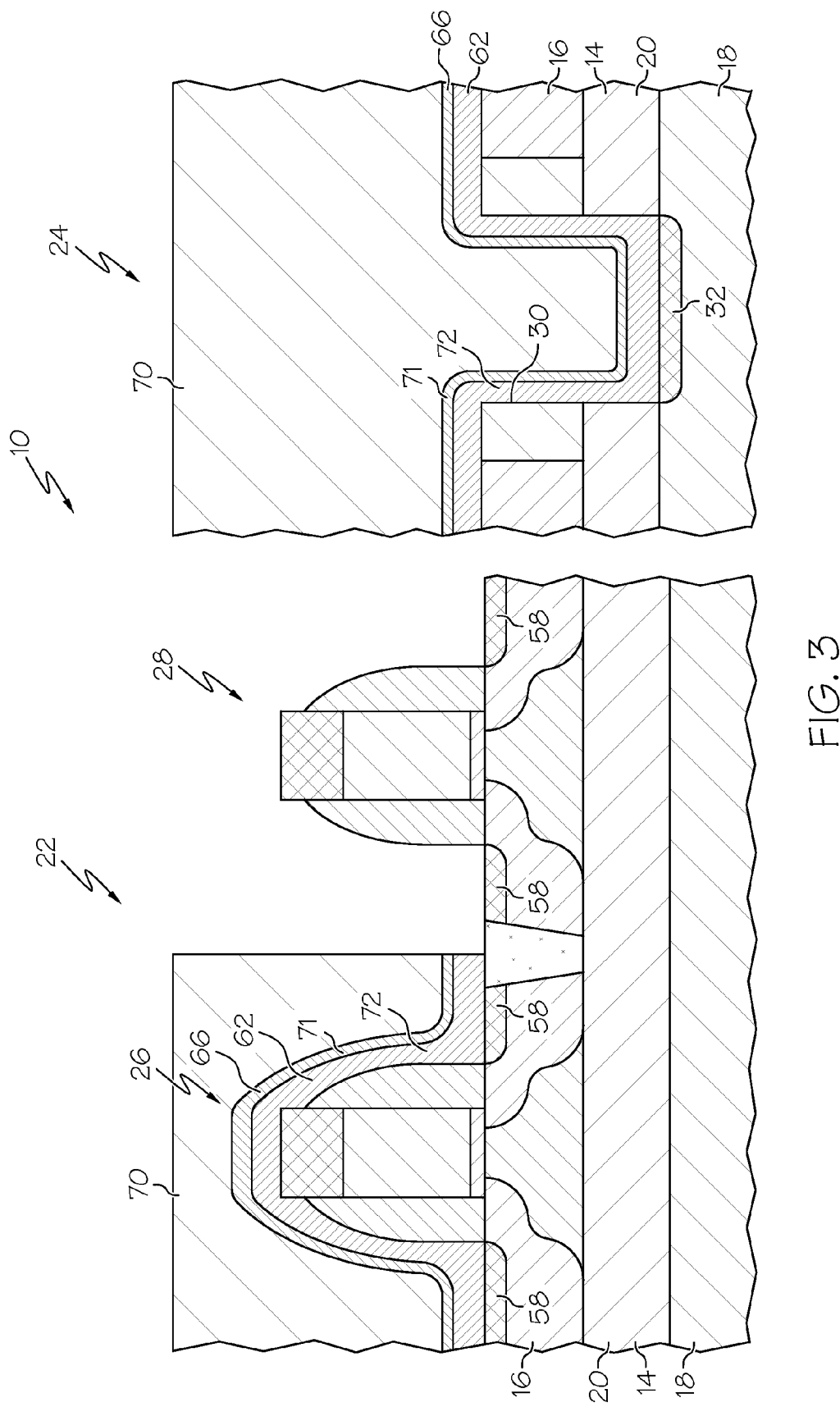

FIG. 3 illustrates, in cross sectional view, the IC 10 at a further advanced fabrication stage in accordance with an exemplary embodiment. The process continues by positioning an etch mask(s) 70 over portions of the oxide and stress-inducing layers 66 and 62 that overlie the transistor 26 and the device region 24, including the trench 30 and the metal silicide region 32. The exposed portion of the oxide and stress-inducing layers 66 and 62 that overlies the transistor 28 (see FIG. 2) is removed using an etching process, such as a dry etching process, e.g., plasma etching. Next, the etch mask(s) 70 is removed to expose the remaining portions 71 and 72 of the oxide and stress-inducing layers 66 and 62, respectively.

Figure 4:
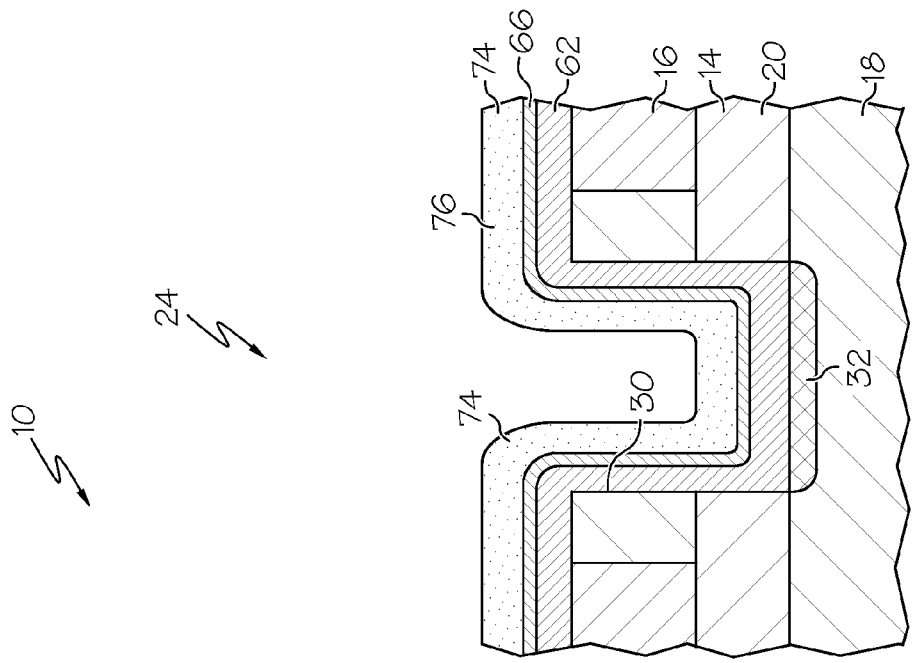
Figure 4:
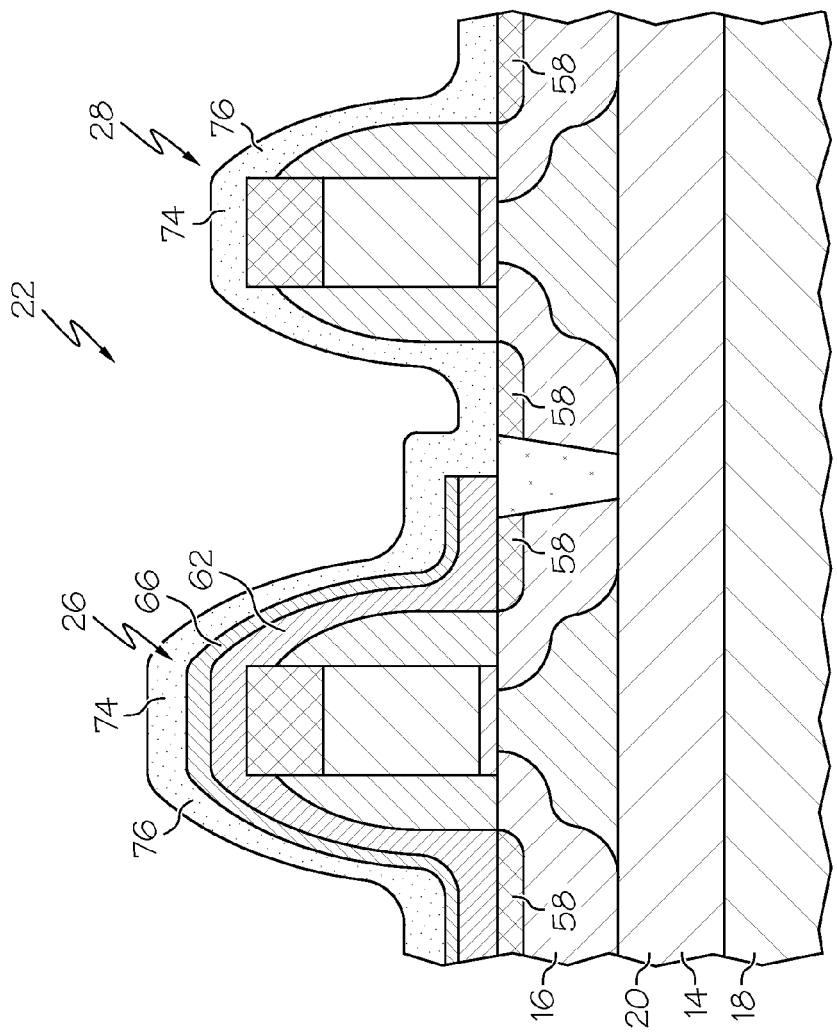

FIG. 4 illustrates, in cross sectional view, the IC 10 at further advanced fabrication stage in accordance with an exemplary embodiment. A stress-inducing layer 74 is formed overlying the transistors 26 and 28, the trench 30, and the metal silicide region 32 by depositing a stress-inducing material 76 over the device regions 22 and 24. As illustrated, the stress-inducing layer 74 is formed on the transistor 28 and on the remaining portions 71 and 72 of the oxide and stress-inducing layers 66 and 62. The stress-inducing material 76 may be deposited using a plasma enhanced chemical vapor deposition (PECVD) process. In an exemplary embodiment, the stress-inducing layer 74 is formed having a thickness of from about 20 to about 150 nm. The stress-inducing material 76 can be any material, such as a layer of stress silicon nitride, capable of providing a relatively high intrinsic stress, e.g., intrinsic tensile stress or intrinsic compressive stress. The stress-inducing layer 74 has a different type of intrinsic stress than the stress-inducing layer 62. In an exemplary embodiment, the stress-inducing layer 74 has an intrinsic compressive stress.

Figure 5:
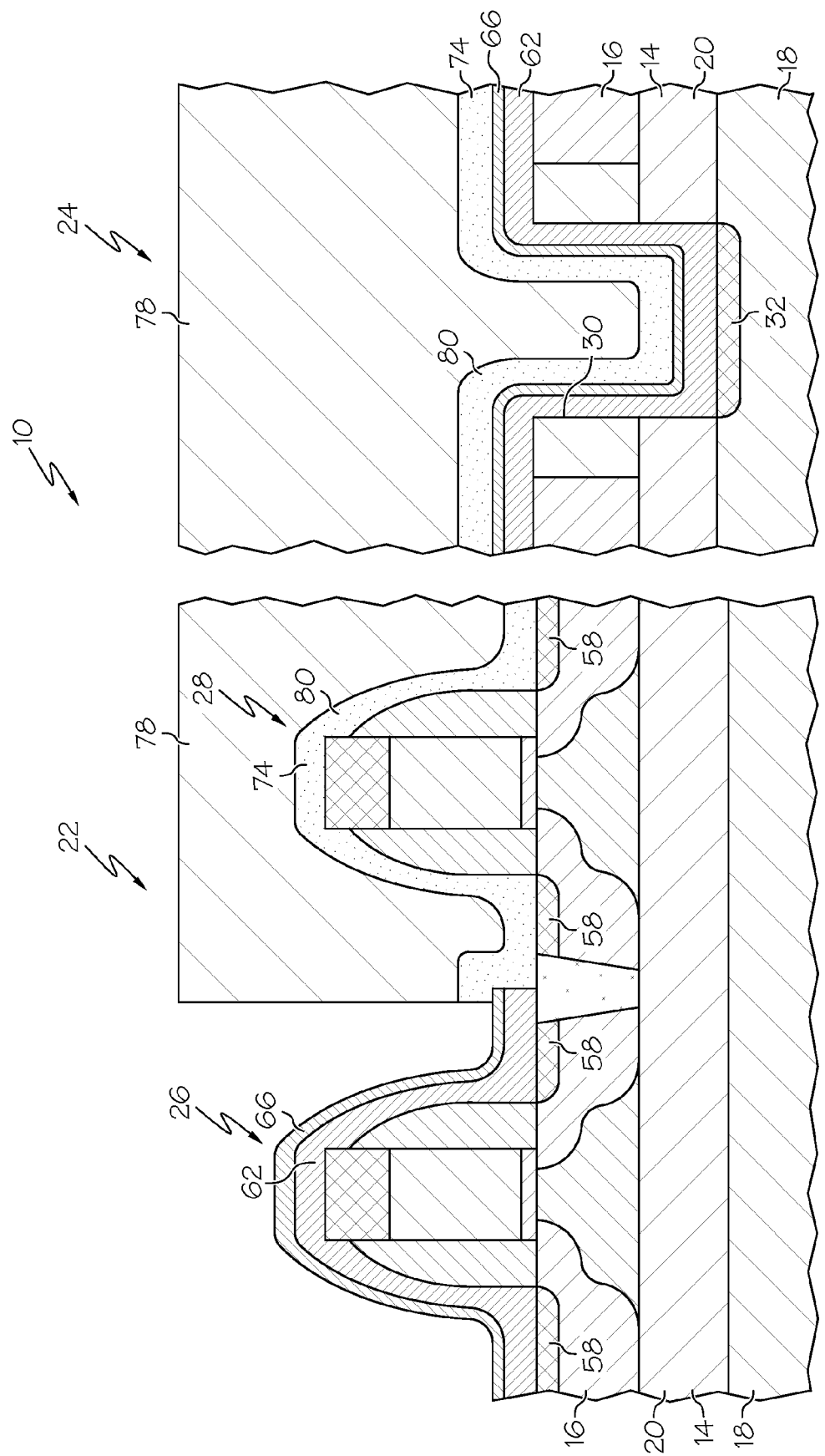

FIG. 5 illustrates, in cross sectional view, the IC 10 at a further advanced fabrication stage in accordance with an exemplary embodiment. The process continues by positioning an etch mask(s) 78 over a portion(s) of the stress-inducing layer 74 that overlie the transistor 28 and the device region 24 including the trench 30 and the metal silicide region 32. The exposed portion of the stress-inducing layer 74 that overlies the transistor 26 (see FIG. 4) is removed using an etching process, such as a dry etching process, e.g., plasma etching. Next, the etch mask(s) 78 is removed to expose the remaining portion 80 of the stress-inducing layer 74. As illustrated, the transistors 26 and 28 are each covered by a single layer of stress-inducing materials 64 or 76 and the trench 30 and the metal silicide region 32 are covered by two layers of stress-inducing materials 64 and 76.

Figure 6:
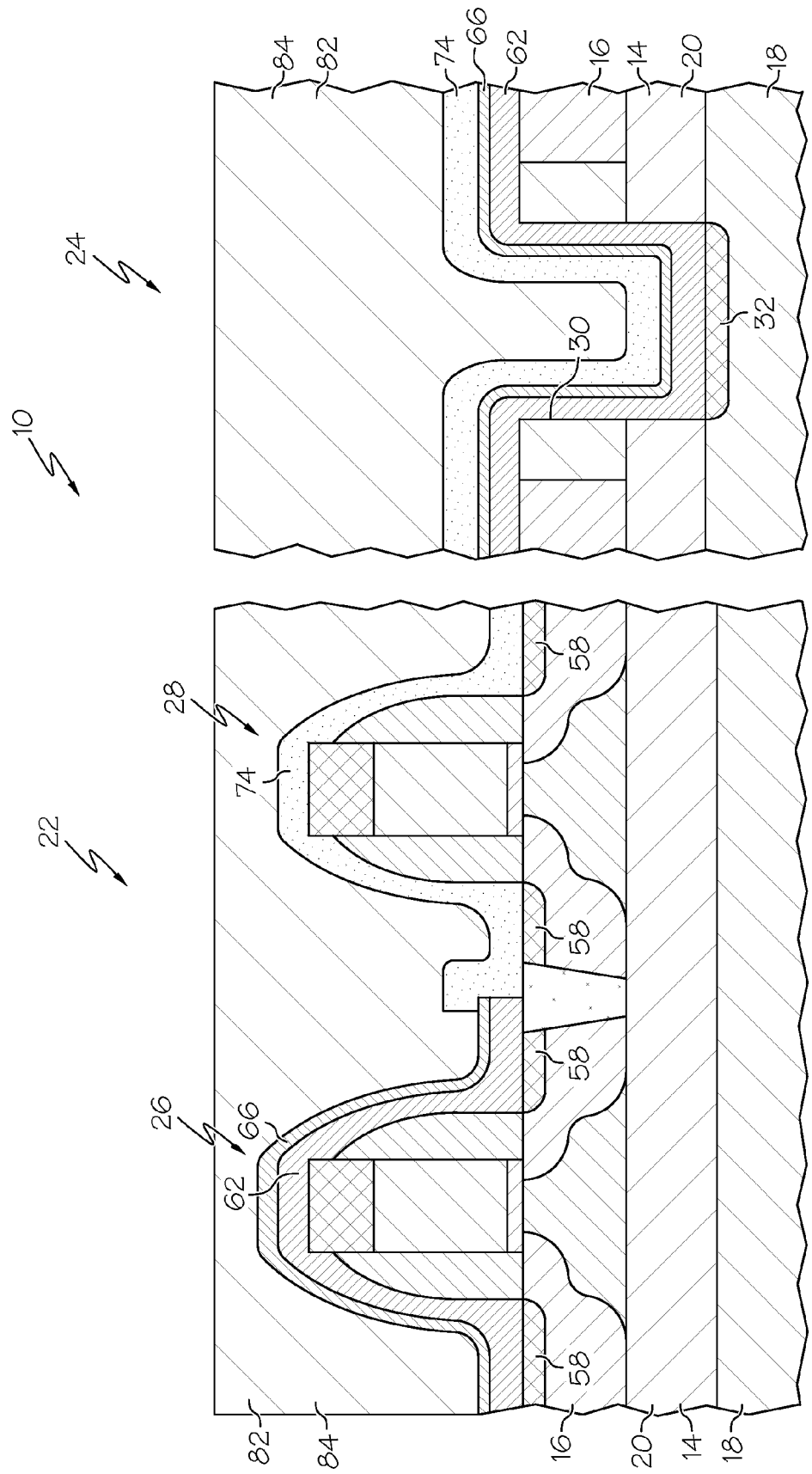

FIGS. 6-8 illustrate, in cross sectional views, the IC 10 at further advanced fabrication stages in accordance with an exemplary embodiment. An interlayer dielectric layer or ILD layer 82 is formed overlying the transistors 26 and 28, the trench 30, and the metal silicide region 32 by depositing a dielectric material 84, such as silicon dioxide, over the respective remaining portions of the stress-inducing layers 62 and 74 and the oxide layer 66 of the device regions 22 and 24. The dielectric material 84 can be deposited, for example, by CVD and the decomposition of a source material, such as tetraethylorthosilicate (TEOS) as is well known in the art. The ILD layer 82 may be subsequently planarized using a CMP process. In an exemplary embodiment, the ILD layer 82 is relatively thick and has a thickness of from about 200 to about 600 nm.

As illustrated in FIG. 8, in an exemplary embodiment, a plurality of trenches 86 including device contact trenches 88 and a substrate contact trench 90 are formed extending through the ILD layer 82 to the respective metal silicide regions 32 and 58. The plurality of trenches 86 can be formed by etching through the ILD layer 82 and the respective stress-inducing layers 62 and 74 and the oxide layer 66 using, for example, a dry etching process such as reactive ion etching using a $CHF_3$, $CF_4$, or $SF_6$ chemistry. In particular, the substrate contact trench 90 is etched in the device region 24 extending through the ILD layer 82 and the two stress-inducing layers 62 and 74 and the oxide layer 66 that are disposed in the trench 30 to expose the metal silicide region 32.

In an exemplary embodiment and as illustrated in FIGS. 7-8, the device and substrate contact trenches 88 and 90 can be formed using two distinct etching processes. For example, the ILD layer 82 can be etched using a first etching process, such as a oxide etching process, e.g., reactive ion etching at conditions for selectively removing oxide material, and using the stress-inducing layer 74 as an etch stop as illustrated in FIG. 7. Next, the respective stress-inducing layers 62 and 74 and the oxide layer 66 can be etched using a second etching process, such as a nitride etching process, e.g., reactive ion etching at conditions for selectively removing nitride material. In practice, because the oxide layer 66 is relatively thin, the nitride etching process may effectively remove the oxide layer 66. As illustrated, the second etching process layer etches through the oxide layer 66 and the stress-inducing layer 62 that are disposed above the metal silicide regions 58 of the transistor 26, and etches through stress-inducing layer 74 that is disposed above the metal silicide regions 58 of the transistor 28 to complete the formation of the device contact trenches 88. The second etching process also completes formation of the substrate contact trench 90 by etching through the stress inducing layers 62 and 74 and the oxide layer 66 that are disposed above the metal silicide region 32.

FIGS. 9-10 illustrate, in cross sectional views, the IC 10 at further advanced fabrication stages in accordance with an exemplary embodiment. The process continues by depositing a conductive material 92 over the device regions 22 and 24. In particular, the device contact trenches 88 and the substrate contact trench 90 are filled with the conductive material 92 to form the device contacts 94 and the substrate contact 12, respectively. The conductive material 92 may be a conductive metal, such as tungsten, or any other conductive material known to those skilled in the art for forming contacts. An excess portion 96 of the conductive material 92 that is disposed above the ILD layer 82 is removed using CMP.

Notably, because the trench 30 and the metal silicide region 32 are covered by the two layers 62 and 74 of stress-inducing materials 64 and 76 (see FIGS. 7-8) that effectively function as spacer layers, the depth of the substrate contact trench 90 through the ILD layer 82, e.g., depth of the etch through the ILD layer via the first etching process as illustrated in FIG. 7, is reduced by the thickness of about at least the layers 62 and/or 74 of stress-inducing materials 64 and 76 than otherwise would be the case without the two layers 62 and 74. As such, the substrate contact 12 can be formed by performing a shallower etch through the ILD layer 82 than conventional processes to improve the robustness of the substrate contact.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method for fabricating an integrated circuit having a substrate contact, the method comprising:
    forming a first trench in a SOI substrate extending through a buried insulating layer to a silicon substrate;
    forming a metal silicide region in the silicon substrate exposed by the first trench;
    forming a first stress-inducing layer overlying the metal silicide region;
    forming a second stress-inducing layer overlying the first stress-inducing layer, wherein the second stress-inducing layer has a different type of intrinsic stress than the first stress-inducing layer;
    forming an ILD layer of dielectric material overlying the second stress-inducing layer;

forming a second trench extending through the ILD layer and the first and second stress-inducing layers to the metal silicide region; and filling the second trench with a conductive material.

2. The method of claim 1, wherein forming the first stress-inducing layer comprises forming the first stress-inducing layer that comprises silicon nitride.

3. The method of claim 1, wherein forming the first stress-inducing layer comprises forming the first stress-inducing layer that has an intrinsic tensile stress.

4. The method of claim 1, wherein forming the first stress-inducing layer comprises forming the first stress-inducing layer using a plasma enhanced chemical vapor deposition (PECVD) process.

5. The method of claim 1, wherein forming the first stress-inducing layer comprises forming the first stress-inducing layer having a thickness of from about 20 to about 150 nm.

6. The method of claim 1, wherein forming the second stress-inducing layer comprises forming the second stress-inducing layer that comprises silicon nitride.

7. The method of claim 1, wherein forming the second stress-inducing layer comprises forming the second stress-inducing layer that has an intrinsic compressive stress.

8. The method of claim 1, wherein forming the second stress-inducing layer comprises forming the second stress-inducing layer using a plasma enhanced chemical vapor deposition (PECVD) process.

9. The method of claim 1, wherein forming the second stress-inducing layer comprises forming the second stress-inducing layer having a thickness of from about 20 to about 150 nm.

10. The method of claim 1, further comprising:

forming an oxide layer overlying the first stress-inducing layer prior to forming the second stress-inducing layer.

11. The method of claim 10, wherein forming the oxide layer comprises forming the oxide layer having a thickness of about 5 to about 20 nm.

12. The method of claim 1, wherein forming the second trench comprises:

etching through the ILD layer using an oxide etching process and using the second stress-inducing layer as an etch stop; and etching through the first and second stress-inducing layers to the metal silicide region using a nitride etching process.

13. The method of claim 1, wherein filling the second trench comprises filling the second trench with the conductive material that comprises tungsten.

14. A method for fabricating an integrated circuit having a substrate contact, the method comprising:

depositing a first stress-inducing layer overlying a first device region and a second device region of an SOI substrate, wherein the first device region has a first transistor and a second transistor that are formed therein, and wherein the second device region has a first trench that extends through a buried insulating layer to a silicon substrate of the SOI substrate and a metal silicide region that is formed in the silicon substrate exposed by the first trench;

etching a first portion of the first stress-inducing layer that overlies the second transistor while covering a second remaining portion of the first stress-inducing layer that overlies the first transistor and the second device region;

depositing a second stress-inducing layer overlying the first and second device regions, wherein the second stress-inducing layer has a different type of intrinsic stress than the first stress-inducing layer;

etching a third portion of the second stress-inducing layer that overlies the first transistor while covering a fourth remaining portion of the second stress-inducing layer that overlies the second transistor and the second device region;

depositing an ILD layer of dielectric material overlying the first and second device regions;

etching a second trench in the second device region extending through the ILD layer and the first and second stress-inducing layers that are disposed in the first trench to expose the metal silicide region; and filling the second trench with a conductive material.

15. The method of claim 14, further comprising:

depositing an oxide layer on the first stress-inducing layer overlying the first and second device regions prior to depositing the second stress-inducing layer.

16. The method of claim 15, wherein etching the third portion of the second stress-inducing layer comprises etching the third portion of the second stress-inducing layer using the oxide layer as an etch stop.

17. The method of claim 15, wherein etching the second trench comprises etching through the ILD layer, the second stress-inducing layer, the oxide layer, and the first stress-inducing layer that are disposed in the first trench.

18. The method of claim 15, wherein etching the second trench comprises:

etching through the ILD layer using an oxide etching process and using the second stress-inducing layer as an etch stop; and etching through the oxide layer and the first and second stress-inducing layers to the metal silicide region using a nitride etching process.

19. The method of claim 14, wherein depositing the first stress-inducing layer comprises depositing the first stress-inducing layer that has an intrinsic tensile stress, and wherein depositing the second stress-inducing layer comprises depositing the second stress-inducing layer that has an intrinsic compressive stress.

20. An integrated circuit including a substrate contact, the integrated circuit comprising:

a SOI substrate having a semiconductor layer, a silicon substrate, and a buried insulating layer that is disposed between the semiconductor layer and the silicon substrate;

a metal silicide region disposed in the silicon substrate, wherein the SOI substrate has a filled trench formed therein extending through the buried insulating layer to the metal silicide region;

a first stress-inducing layer disposed in the filled trench overlying the metal silicide region;

a second stress-inducing layer disposed in the filled trench overlying the first stress-inducing layer, wherein the second stress-inducing layer has a different type of intrinsic stress than the first stress-inducing layer;

an ILD layer of dielectric material overlying the second stress-inducing layer; and the substrate contact comprising a conductive material extending through the ILD layer and the first and second stress-inducing layers to the metal silicide region.

* * * * *